United States Patent
Wims et al.

(10) Patent No.: US 7,239,126 B2
(45) Date of Patent: Jul. 3, 2007

(54) SYSTEM BENCH WIRELESS MAPPING BOARD

(75) Inventors: Brian A. Wims, Detroit, MI (US); Lekia P. Townsend, Southfield, MI (US)

(73) Assignee: General Motors Corporation, Detroit, MI (US)

( * ) Notice: Subject to any disclaimer, the term of this patent is extended or adjusted under 35 U.S.C. 154(b) by 345 days.

(21) Appl. No.: 10/601,467

(22) Filed: Jun. 23, 2003

(65) Prior Publication Data

US 2004/0257065 A1    Dec. 23, 2004

(51) Int. Cl.
*G01R 31/02*    (2006.01)

(52) U.S. Cl. .................... 324/158.1; 324/73.1; 324/765

(58) Field of Classification Search ............. 324/158.1, 324/765, 754, 761, 762; 439/66
See application file for complete search history.

(56) References Cited

U.S. PATENT DOCUMENTS

| | | | | |
|---|---|---|---|---|
| 2,050,092 A * | 8/1936 | Gerstle | ........................ | 324/407 |
| 2,784,371 A * | 3/1957 | Stock | ......................... | 324/407 |
| 2,795,755 A * | 6/1957 | Anthes et al. | ............... | 324/407 |
| 2,881,385 A * | 4/1959 | Smith | ......................... | 324/407 |
| 3,235,797 A * | 2/1966 | Boscia et al. | ............... | 324/72.5 |
| 3,302,109 A * | 1/1967 | Jones | ......................... | 714/736 |
| 3,409,828 A * | 11/1968 | Kelsey | ...................... | 324/72.5 |
| 3,549,996 A * | 12/1970 | Vaughan | ..................... | 324/114 |
| 3,646,438 A * | 2/1972 | Staff | ......................... | 324/72.5 |
| 3,723,867 A * | 3/1973 | Canarutto | .................... | 324/523 |
| 3,870,953 A * | 3/1975 | Boatman et al. | ........... | 324/72.5 |
| 4,196,386 A * | 4/1980 | Phelps | ......................... | 714/734 |
| 4,211,917 A * | 7/1980 | Hofmann | ..................... | 714/724 |
| 4,348,636 A * | 9/1982 | Doundoulakis | ............... | 714/46 |
| 4,525,802 A * | 6/1985 | Hackamack | ................. | 361/683 |
| 4,561,093 A * | 12/1985 | Doane et al. | .................. | 714/46 |
| 4,746,861 A * | 5/1988 | Nesbitt | ........................ | 324/761 |
| 4,769,596 A * | 9/1988 | Faucett | ........................ | 324/557 |
| 4,771,234 A * | 9/1988 | Cook et al. | .................. | 324/754 |
| 5,406,197 A * | 4/1995 | Mercier et al. | ........... | 324/158.1 |
| 5,646,522 A * | 7/1997 | Etemadpour et al. | ..... | 324/158.1 |
| 6,094,057 A * | 7/2000 | Hiruta et al. | ................ | 324/755 |
| 6,181,146 B1 * | 1/2001 | Koyama | ...................... | 324/755 |
| 6,677,745 B2 * | 1/2004 | Mayr et al. | .............. | 324/158.1 |

* cited by examiner

*Primary Examiner*—Ernest Karlsen
(74) *Attorney, Agent, or Firm*—Anthony Luke Simon

(57) ABSTRACT

A system for testing electronic modules comprising at least one mapping board box, and at least one harness operably attached to the mapping board box with a harness port is disclosed. The mapping board box comprises pin receptors, wherein the receptors are in communication with a pinned circuit board to comprise a system for testing electronic modules. The mapping board box is pre-wired to receive circuit boards with a variety of pin configurations.

7 Claims, 7 Drawing Sheets

SYSTEM BENCH WIRELESS MAPPING BOARD

BACKGROUND OF THE INVENTION

Printed circuit boards (PCB) and embedded software have become common place in consumer and commercial products. As use of PCBs and embedded software has increased, so has the use of electronic modules. An electronic module (ECU) is a circuit on a PCB that performs a specific function. The ECU may use embedded software to perform complex functions. In modern automobiles, electronic modules perform a variety of functions, and control a wide variety of devices. In automobiles, electronic modules control the radio, brakes, overhead lighting, cruise control, wipers, etc. Outside of automobiles, electronic modules can control any electronic device, from streetlights to cameras, from televisions to telephones.

Design engineers test systems of electronic modules to verify a new system's functionality. The engineers design and build test benches containing all of the electronic modules within the new system. An example of a system may be an entire electronic system in an automobile or an airplane. The testing of a system is done early in the design process, and therefore the actual, production-intent wiring harnesses are not available to interconnect the ECUs. Since the design engineers need to test the system functionality before the final electrical harnesses are created, they need to manually design and build a custom harness. After the engineer designs a new custom harness, a circuit map is created that indicates where the electrical signals from the ECUs should connect. The circuit map may involve the use of a spreadsheet program, such as Microsoft Excel from Microsoft, Inc. of Redmond, Wash.

To ensure that the new system, and therefore the ECUs, function as designed, the ECUs are tested. Electronic module simulators are known to those of ordinary skill in the art. The simulators simulate the sensor inputs to ECUs, such that the ECU software operates as though in the real environment. For example, instead of having a real engine present, the simulator simulates a real operating engine. As a result the ECU's software "thinks" it's connected to a real engine. It is also known that a system may comprise the use of multiple ECUs, each of which must be tested, alone and in concert with the other ECUs that comprise the new system.

As electronic modules have grown in popularity, they have also grown in complexity. Complexity may be measured, at least in part, by the number of pins inserted into the board, by the number of boards required for the electronic module, and by the amount of embedded software within each electronic module. Furthermore, while the actual testing of the electronic system is a complex process, preparing the new system for testing has been a comparatively time consuming, and error-prone process.

In order to test the new electronic system, it is necessary to ensure that current flows and all the software functions as desired by the engineer. This assurance is provided by connecting the ECUs to ECU Simulators and by interconnecting the ECUs to each other. The interconnections represent the future interconnections in the new system. Each ECU pin is connected to a wire that is connected to a specific input of the simulators or other ECUs. This laborious process is fraught with the potential for error. Each pin is manually connected using a wire. While this process may be relatively efficient for 5 or 6 pins, when 500 or 600 pins are connected, the efficiency is degraded. When 3000 or 4000 pins are interconnected, efficiency is nearly lost. Furthermore, although complete accuracy is needed to ensure an accurate test, accuracy is quite difficult to obtain through a maze of 3000 wires.

FIG. 1 illustrates a prior art testing system bench 100. System Bench 100 comprises terminal strips 105 in electric communication with ECUs 130 and simulators 140 via wires 120. Wires 120 are individually connected to a particular pin on terminal strips 105. Between the individual pins on the terminal strips, the engineers manually wire all the interconnections between each module 130 and each simulator 140. The manual wiring is done to represent the same interconnections on the future vehicle the system bench 100 represents. Those of ordinary skill in the art are well aware that the use of terminal strips 105 is optional and often the engineers directly wire the interconnects between ECUs 130 and simulators 140. Although FIG. 1 is shown with 9 total ECUs 130 and simulators 140, those of ordinary skill in the art are well aware that systems with as few as one ECU are possible, with only practical limits for an upper bound for the number of ECUs 130 and simulators 140. The complexity of the system bench 100 correlates directly, and in some systems exponentially, with the number of ECUs 130 and simulators 140, and therefore the number of wires 120.

What is needed therefore, is an improved apparatus and method for testing electronic modules that overcomes these, and other, limitations.

SUMMARY OF THE INVENTION

One aspect of the invention provides a system for testing electronic modules. The system comprises at least one mapping board box including at least one harness port and at least one harness operably connected at one end to the at least one harness port. The mapping board box further includes a plurality of electrical connection points in electronic communication with the at least one harness port. The electrical connection points are adapted to communicate between pins on ECUs and simulators, wherein the mapping board box is pre-wired to receive circuit boards with a variety of ECU configurations.

In another aspect of the invention, a method of building the system to test an electronic module is provided. The method comprises pinning a circuit board corresponding to the interconnections between electronic modules and simulators and inserting the pinned circuit board into a pre-wired mapping board box.

In yet another aspect of the invention, a system for testing an electronic module is provided. The system comprises means for receiving a circuit board and means for communicating between the circuit board receiving means and an electronic module.

The aforementioned, and other features and advantages of the invention, will become further apparent from the following detailed description of the presently preferred embodiments, read in conjunction with the accompanying drawings. The detailed description and drawings are merely illustrative of the invention rather than limiting, the scope of the invention being defined by the appended claims and equivalents thereof.

DETAILED DESCRIPTION OF THE DRAWINGS

Figure 5:
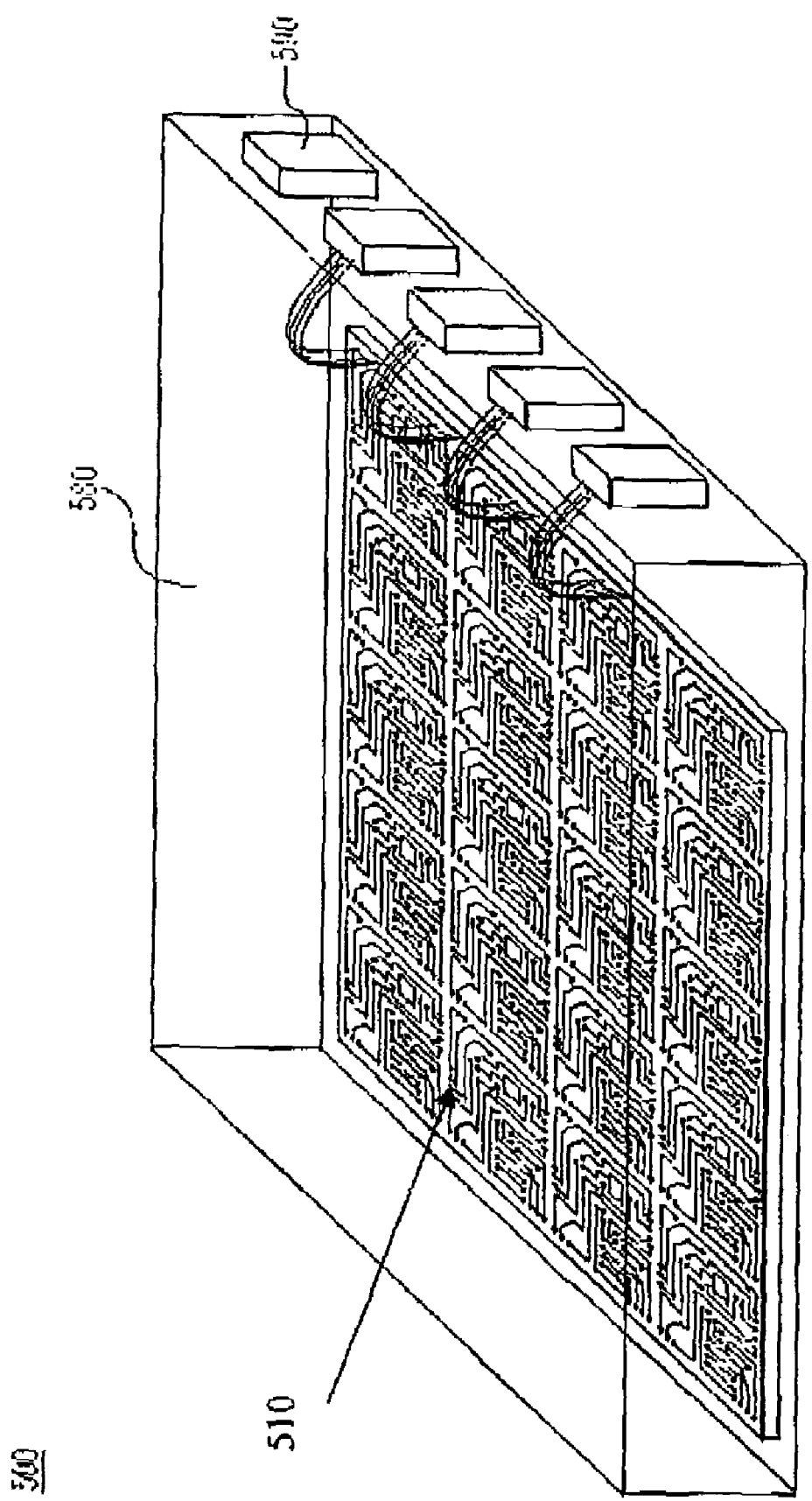
FIG. 5 illustrates a wireless mapping board box in accordance with one aspect of the instant invention.

FIG. 5 illustrates a wireless mapping board box 500 in accordance with one aspect of the invention. Box 500 comprises a wireless mapping board 510, a mapping board box 580 and harness ports 590.

Wireless mapping board 510 is any pinned PCB. Board 510 may comprise any appropriate substrate for maintaining a circuit trace on its surface. Board 510 may comprise any number of traces of any length. Board 510 further comprises at least one pin connecting at least one trace. In a currently preferred embodiment, wireless mapping board may comprise between 0 and 560 pins in the board. In an exemplary embodiment, board 510 is sized to fit within mapping board box 580.

Mapping board box 580 is a box adapted to receive a wireless mapping board. In a currently preferred embodiment, box 580 is sized to contain the wireless mapping board 510, although other sizes are contemplated. Mapping board box 580 further comprises at least one harness port 590. In a currently preferred embodiment, mapping board box 580 comprises 10 harness ports. Mapping board box 580 may comprise any appropriate material, including but not limited to plastics, metals, and wood. Mapping board box 580 further comprises means, or pin receptors, to receive the pins that are pinned to board 510. In an exemplary embodiment, box 580 comprises 560 pin receptors. Each pin receptor is pre-wired to connect with the harness port 590. In an exemplary embodiment, the pin receptors are arranged in grid fashion. In a currently preferred embodiment, the mapping board box comprises a grid of pin receptors equidistantly disposed amongst each other.

Figure 1:
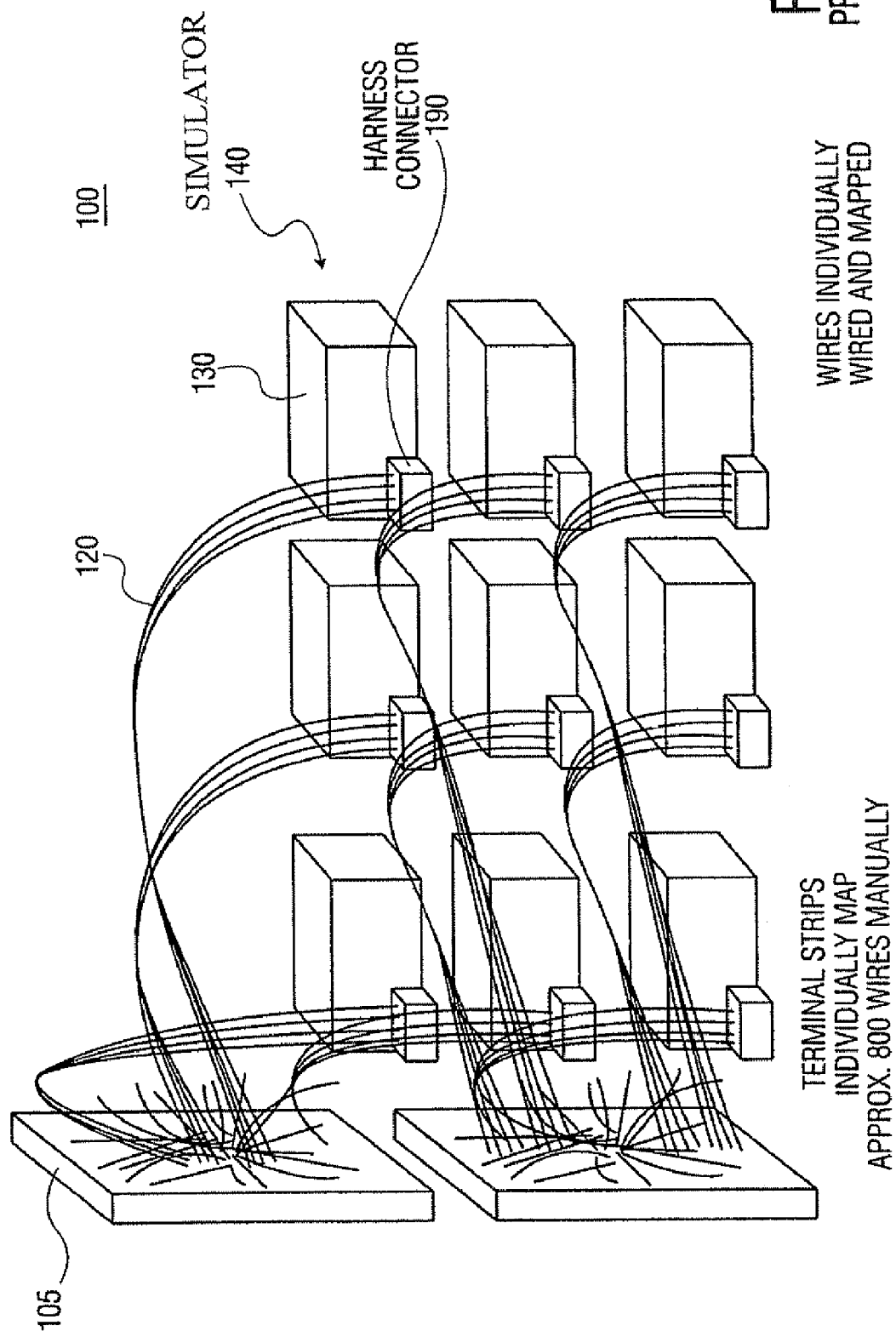
FIG. 1 shows a prior art system for testing electronic modules.
Figure 6:
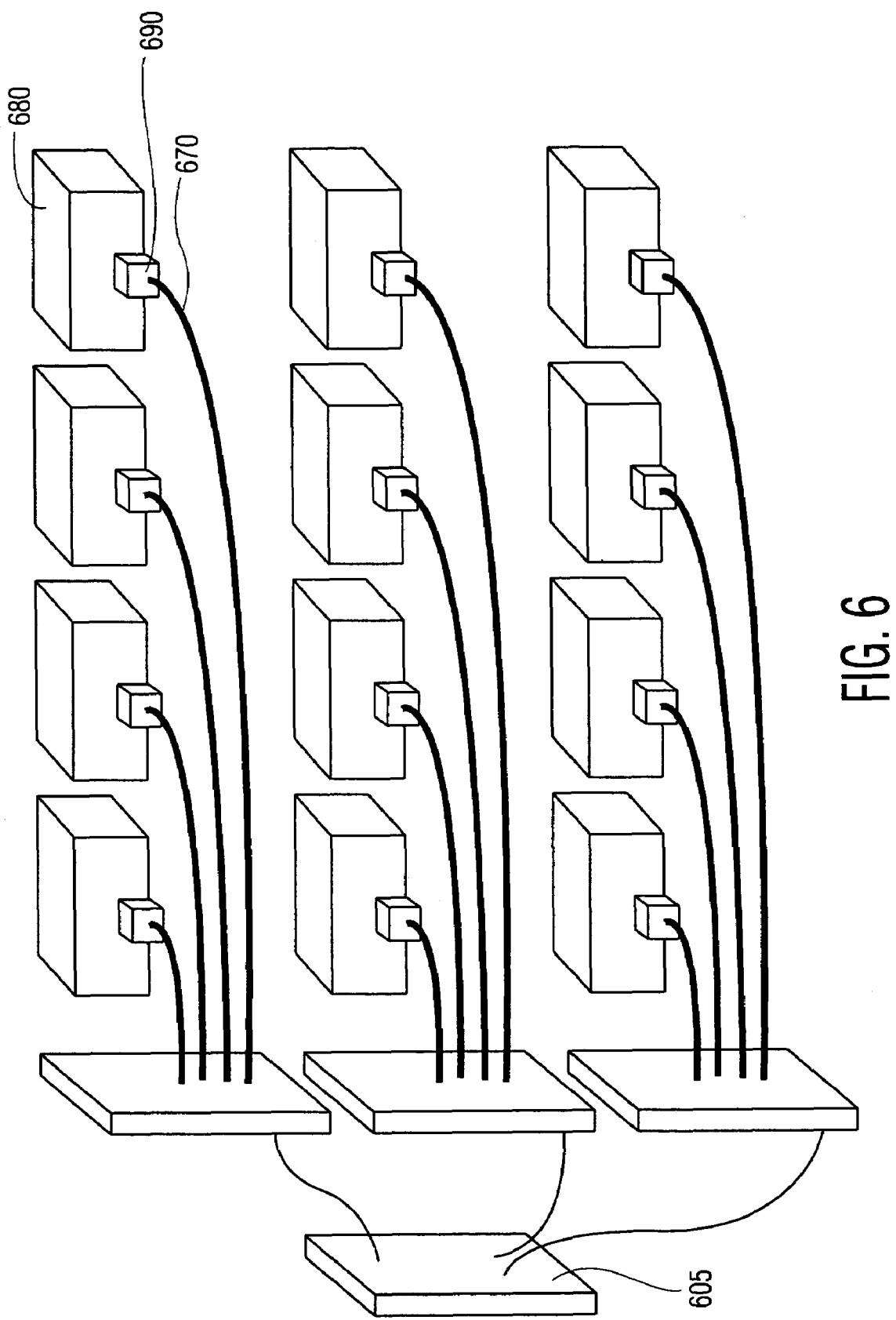
FIG. 6 illustrates a system for testing electronic modules in accordance with one aspect of the invention.

Harness port 590 is an electrical connector that allows for communication between the board 510 and the testing unit (not shown in FIG. 5, but illustrated in FIG. 1 as 130 and in FIG. 6 as 690). Each harness port comprises at least one pin. In an example, and a currently preferred embodiment, harness port 590 comprises a 56 pin electrical connector, as known in the art. Each pin of the harness port 590 is in communication with a pin receptor of the box 580. While the system is in use, the pins of harness port 590 are further in communication with the pins of the board 510 through the pin receptors of the box 580. In a currently preferred embodiment, 10 harness ports 590 are attached to the wireless mapping board 510, with each harness port 590 comprising 56 pins, and each connector pin is in electrical communication with a pin receptor of the board 510.

Figure 2:
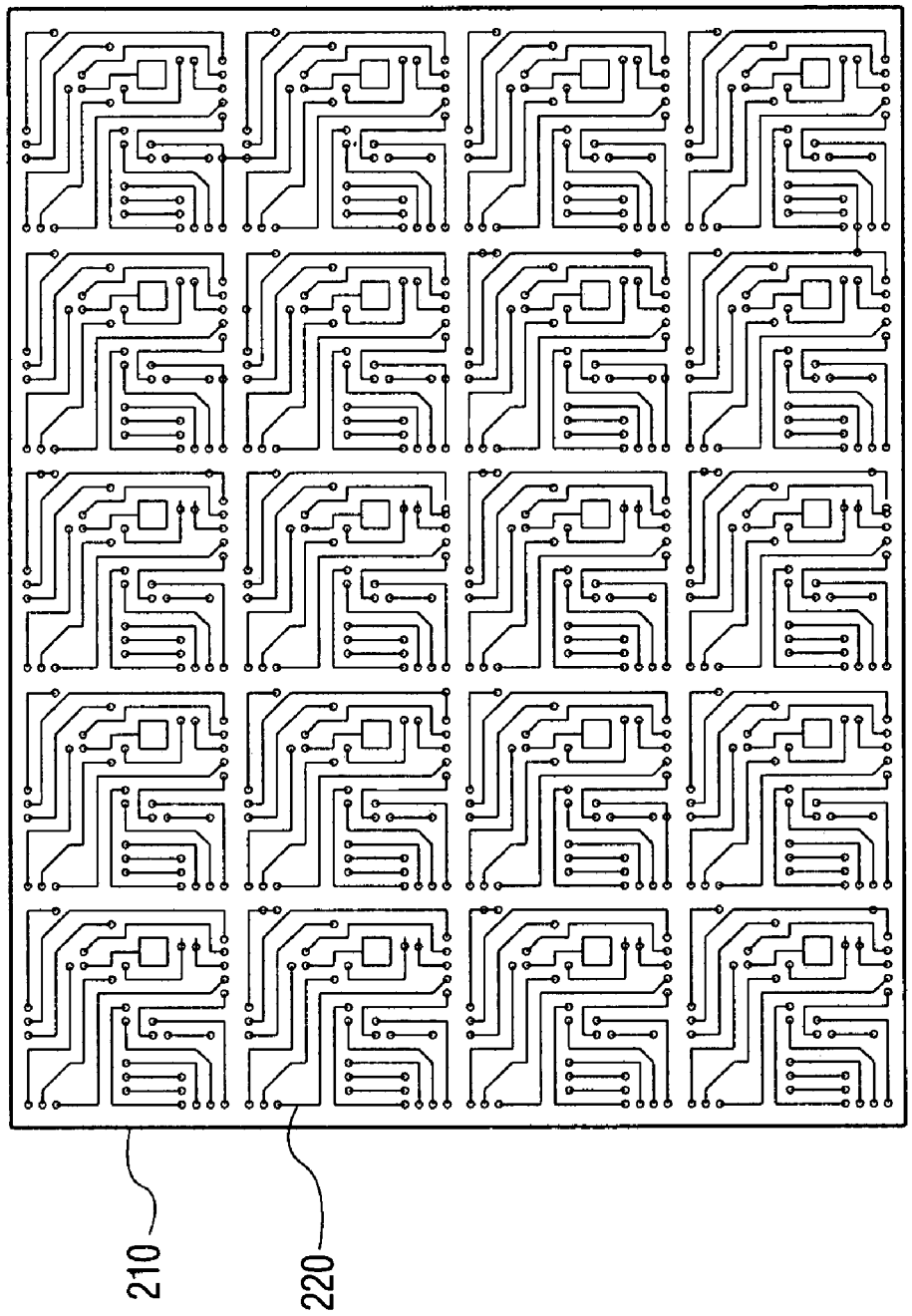
FIG. 2 illustrates traces on a printed circuit board, as is known in the art.
Figure 3:
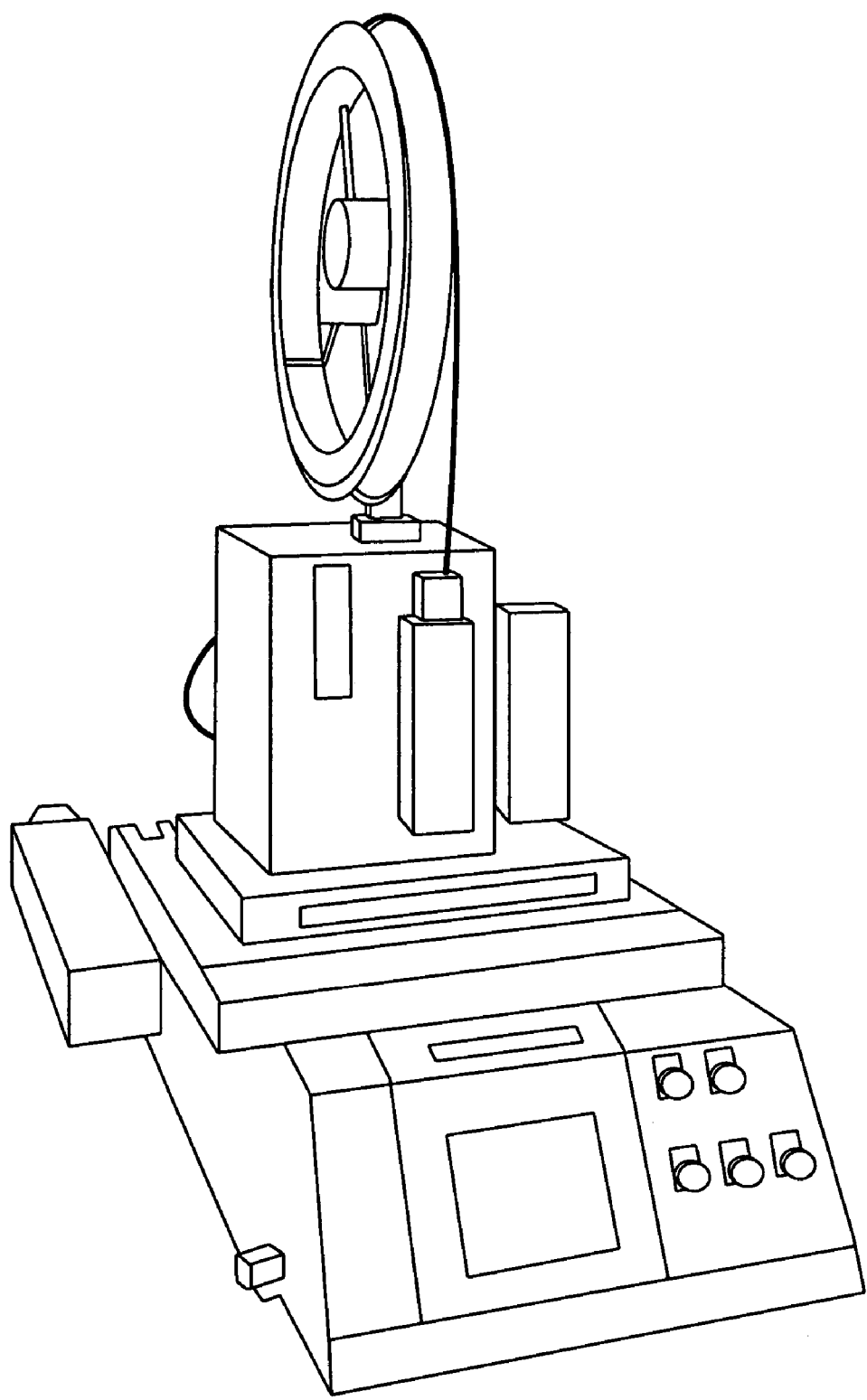
FIG. 3 pictures an autosplice pin installation machine, as is known in the art.
Figure 4:
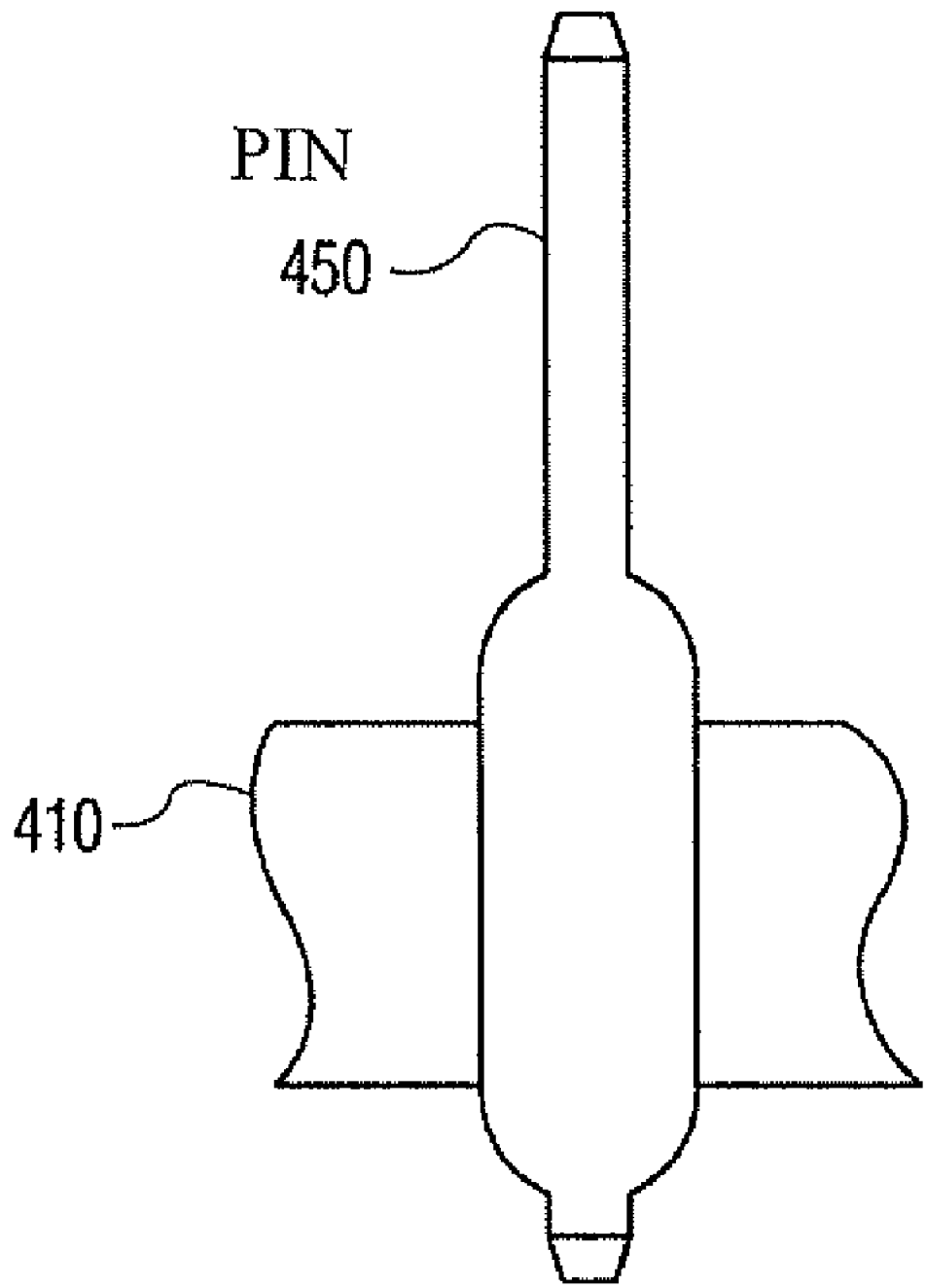
FIG. 4 shows a cross section of a pinned printed circuit board, as is known in the art.

In an embodiment of the invention; an Autosplice machine, AutoSplice Inc. San Diego Calif., in FIG. 3 reads a circuit map as provided by the engineer, and places a "pin" at the specified location to connect the branches of the pre-printed PCB. Use of an AutoSplice machine provides an alternative process to manually wiring the interconnections. Once the PCB is pinned, the new Electrical System is intended to become functional, as the circuit should be complete, with an uninterrupted current flow from the input of the PCB to the output of the PCB. FIG. 2 illustrates a pre-printed PCB 200, comprising a substrate 210 and traces 220. FIG. 4 is a cross section of a pinned PCB. As shown in FIG. 4, a pinned PCB comprises the substrate 410 and a pin 450. Pin 450 extends at least partially though the thickness of the substrate 410 to ensure that the traces (not shown in FIG. 4) on the PCB are in electric communication.

FIG. 6 shows an electronic module 680 attached to wireless mapping boxes 605 with generic harnesses 670 in accordance with one aspect of the instant invention. Generic harnesses 670 attach to the box 680 with harness ports 690 (as in the harness ports 590 of FIG. 5) and enable electrical communication between the boxes. Box 605 is as described for Box 580 in FIG. 5. Harness 670 is adapted to be compatible with the harness ports 590 of FIG. 5. Harness 670 comprises wires that connect the pin receptors, and the pins from the mapping box 680 with the electronic modules being tested. In a currently preferred embodiment, harness 670 comprises 56 wires that communicate with the 56 pin receptors of the box that communicate with 56 pin receptors that communicate with 56 pins on the PCB to be tested. FIG. 6 further shows board 510 disposed within box 605.

Figure 7:
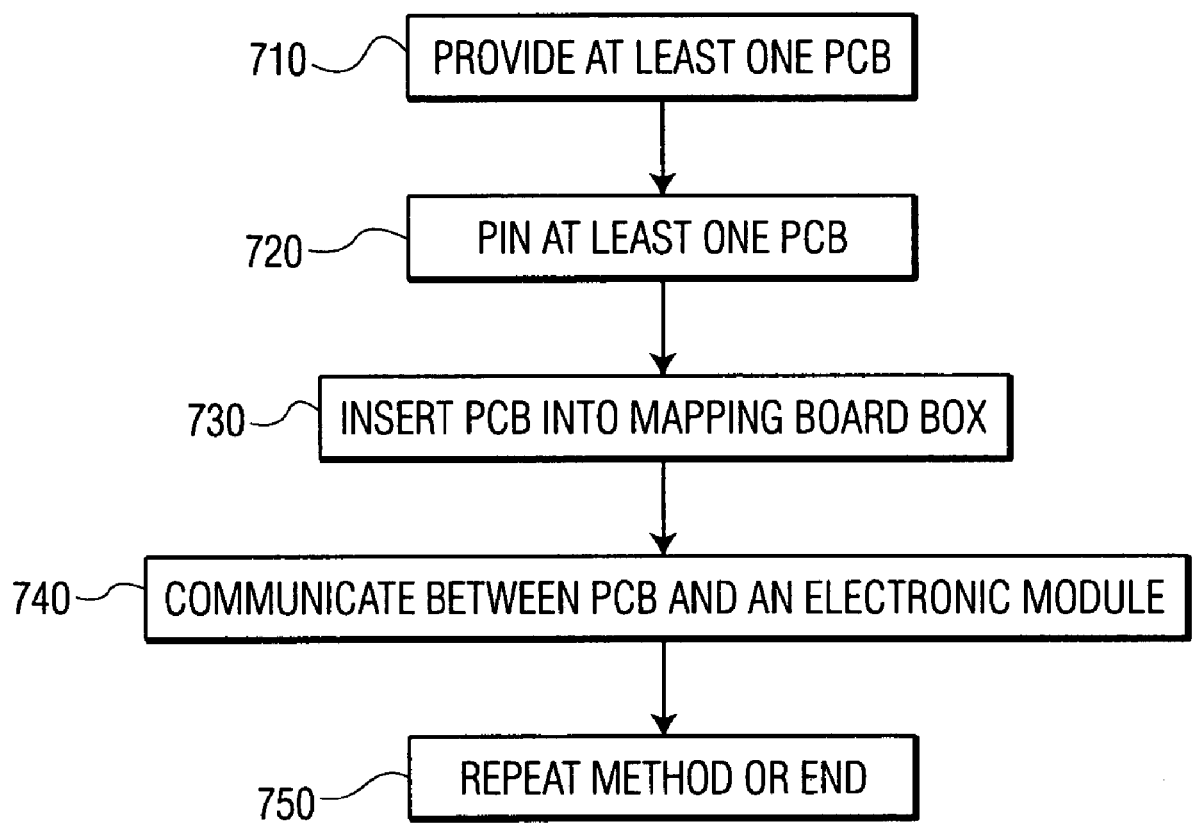
FIG. 7 is a flowchart representing a method in accordance with another aspect of the invention.

FIG. 7 illustrates in flowchart fashion a method 700 of testing an electronic module. Method 700 begins at 710 when at least one printed circuit board is provided. Methods of obtaining and manufacturing printed circuit boards are well known to those of ordinary skill in the art. The at least one printed circuit board comprises printed traces on a substrate.

Method 700 continues by pinning the at least one printed circuit board to create an electronic module (Step 720). In a currently preferred embodiment, the at least one printed circuit board is pinned with an automatic pinning machine, although manual techniques for pinning circuit boards are known in the art.

The at least one pinned circuit board is inserted into at least one pre-wired mapping board box (Step 730). The at least one mapping board box is pre-wired to create electrical connection points, or pin receptors. When the pinned circuit board is inserted into the mapping board box, the pins are placed in electrical communication with the connections points or pin receptors. In a currently preferred embodiment, the mapping board box comprises a grid of pin receptors equidistantly disposed amongst each other.

The printed circuit board communicates with an electronic module via the mapping board box and a harness (Step 740). This communication allows for the printed circuit board to be tested, to both ensure that the circuit operates to fulfill its intended purpose and to ensure that the board was correctly pinned.

The method may be repeated to test further electronic modules, or the method may end if no further electronic modules are to be tested (Step 750).

In operation, testing of an electronic module is simplified using a system as described in this invention. Use of the invention allows automatic routing of signals with autosplice pins rather than manually mapping the board. Any variety of electrical systems may be tested using the instant invention. Automatic routing improves the art by reducing manual wiring errors, and allowing benches to be reconfigured within 24 hours. Use of the pre-wired mapping board box enables the use of generic and reusable harnesses. Furthermore, the complexity of testing electronic modules is reduced by reducing manual wiring and reducing the time required to test the module. The ease of testing is increased by the use of generic harnesses, and the incidence of wiring errors may also be reduced. These factors may allow for cost savings and improve speed to market new electronic modules. In one experimental use, the time to construct a system bench was reduced from 6 months to one week.

The scope of the invention is indicated in the appended claims. We intend that all changes or modifications within the meaning and range of equivalents are embraced by the claims.

What is claimed is:

1. A system for testing electronic modules comprising:
   at least one mapping hoard box including at least one harness port;
   at least one harness operably connected at one end to the at least one harness port,
   the mapping board box including a plurality of pin receptors in electronic communication with the at least one harness port, the pin receptors adapted to communicate with a circuit printed on a circuit board with pins, wherein the mapping board box is pre-wired to receive each of a plurality of circuit boards having different pin configurations.

2. The system of claim 1 wherein the dimensions of the at least one mapping board box are sized to fit a printed circuit board.

3. The system of claim 1 wherein the at least one harness port comprises 56 pins.

4. The system of claim 1 wherein the at least one mapping board box comprises 56 pin receptors.

5. The system of claim 1 wherein the at least one harness comprises a generic harness.

6. The system of claim 5 wherein the generic harness comprises 56 wires.

7. The system of claim 1 further comprising an electronic simulator.

* * * * *